United States Patent
Kweon et al.

[11] Patent Number: 6,162,649
[45] Date of Patent: Dec. 19, 2000

[54] METHOD OF MANUFACTURING FERROELECTRIC MEMORY DEVICE

[75] Inventors: Soon Yong Kweon; Seung Jin Yeom, both of Kyoungki-do, Rep. of Korea

[73] Assignee: Hyundai Electronics Industries Co., Ltd., Kyoungki-do, Rep. of Korea

[21] Appl. No.: 09/456,364

[22] Filed: Dec. 8, 1999

[30] Foreign Application Priority Data

Dec. 22, 1998 [KR] Rep. of Korea ...................... 98-57283

[51] Int. Cl.⁷ .................................................. H01L 21/00
[52] U.S. Cl. ........................... 438/3; 438/240; 438/393; 438/239; 438/250
[58] Field of Search .................... 438/381, 393, 438/3, 239, 240, 250

[56] References Cited

U.S. PATENT DOCUMENTS

| | | | |
|---|---|---|---|
| 5,468,684 | 11/1995 | Yoshimori et al. | 437/228 |
| 5,585,300 | 12/1996 | Summerfelt | 438/240 |
| 5,612,560 | 3/1997 | Chivukula et al. | 257/309 |
| 5,717,157 | 2/1998 | Tomozawa et al. | 136/236.1 |
| 5,789,268 | 8/1998 | Chivukula et al. | 437/60 |
| 5,793,600 | 8/1998 | Fukuda et al. | 361/321.4 |
| 5,854,499 | 12/1998 | Nishioka | 438/240 |
| 5,973,911 | 10/1999 | Nishioka | 361/313 |

FOREIGN PATENT DOCUMENTS

| | | | |
|---|---|---|---|
| 10-079481 | 3/1998 | Japan | H01L 27/108 |
| 10-093043 | 4/1998 | Japan | H01L 27/108 |
| 10-242409 | 9/1998 | Japan | H01L 27/10 |
| 10-303377 | 11/1998 | Japan | H01L 27/10 |
| 11-040869 | 2/1999 | Japan | H01L 41/187 |

Primary Examiner—Trung Dang
Attorney, Agent, or Firm—Ladas & Parry

[57] ABSTRACT

A method of manufacturing a ferroelectric memory device capable of effectively preventing Ti from diffusing into a ferroelectric layer during thermal-treating of TiN/Ti which will be performed after, is disclosed. According to the present invention, a Pt layer for an upper elctrode of a capacitor is formed to a multi-layer by multi-step at high temperature, high pressure and low power, to densify its grain boundary. Furthermore, by adding $O_2$ to sputtering gas when forming the Pt layer, thereby preventing Ti from diffusing into a ferroelectric layer through the Pt layer of the upper electrode. As a result, the electrical properties of a ferroelectric memory device are improved.

6 Claims, 3 Drawing Sheets

METHOD OF MANUFACTURING FERROELECTRIC MEMORY DEVICE

BACKGROUND OF THE INVENTION

1. Field of the Invention

The present invention to a method of manufacturing semiconductor device, more particularly to a method of manufacturing ferroelectric random access memory device.

2. Description of the Related Art

In general, a titanium (Ti) layer is formed between a metal layer and an oxide layer as an adhesion layer for improving adhesion therebetween in manufacturing semiconductor device. It is also used to form silicide for lowering contact resistance between an active region of a transistor and a metal layer. In this case, a titanium nitride (TiN) layer is formed between the active region and the silicide layer as a diffusion barrier layer for preventing diffusion of Ti and Si. Therefore, a stacked structure of TiN/Ti in which the TiN layer is formed on the Ti layer, is formed under the metal layer when forming a metal interconnection line.

Furthermore, in case an upper electrode of a capacitor formed of a platinum (Pt) layer is connected to an active region of a transistor by a metal layer such as Al layer and W layer in a ferroelecric memory device, the stacked structure of TiN/Ti is formed prior to forming the metal layer.

However, when forming the Pt layer as the upper electrode of the capacitor using a sputtering method, the Pt layer is conventionally grown to columnar structure and its grain boundary is not dense. As a result, Ti is diffused into a ferroelectric layer along the interface of Pt, thereby deteriorating properties of the ferroelectric layer.

SUMMARY OF THE INVENTION

It is therefore an object of the present invention to method of manufacturing a ferroelectric memory device which can effectively prevent to diffuse Ti into a ferroelectric layer, for solving the problems in the conventional art.

To accomplish this above objects, a method of manufacturing a ferroelectric memory device according to the present invention, includes the steps of: forming a first intermediate insulating layer on a semiconductor substrate on which a transistor is formed; forming a first conductive layer for a lower electrode of a capacitor and a ferroelectric layer on the first intermediate insulating layer, in sequence; and forming a Pt layer for an upper electrode of the capacitor on the ferroelectric layer to a multi-layer structure, the Pt layer containing oxygen therein.

In this invention, the Pt layer is formed to the multi-layer structure to increase diffusion path, thereby preventing to diffuse Ti into the ferroelectrice layer through the grain boundary of the Pt layer.

In this invention, $O_2$ gas is added to sputtering gas when depositing Pt layer, so that the grain boundary of the Pt layer includes $O_2$, thereby trapping Ti diffused into the ferroelectric layer during thermal-treating which will be performed after. As a result, the properties of the ferroelectric layer are improved.

Additional object, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

DETAILED DESCRIPTION OF THE INVENTION

Hereinafter, a preferred embodiment of the present invention will be explained with reference to accompanying drawings.

Figure 1:
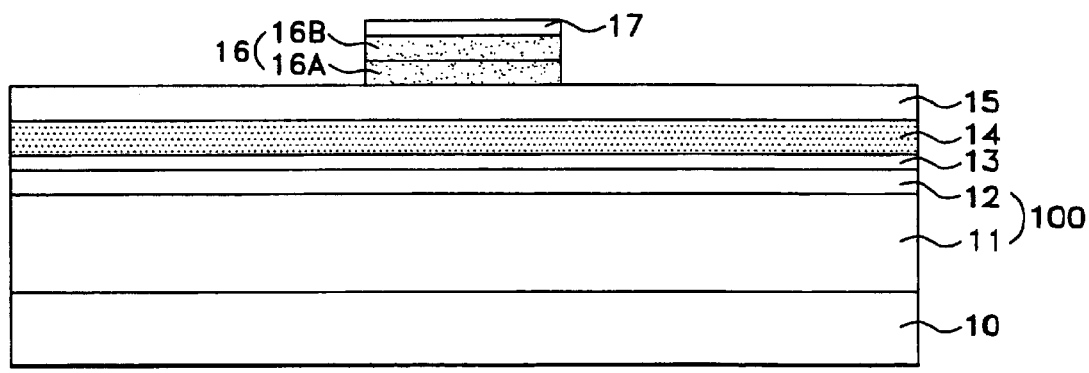
FIG. 1 is a cross sectional view showing the step of forming an upper electrode by forming a Pt layer for an upper electrode to a multi-layer and etching the Pt layer.

Referring to FIG. 1, a first intermediate insulating layer 100 formed of a boro-phosphor silicate glass (BPSG) layer 11 and a medium temperature oxide (MTO) layer 12 is formed on a semiconductor substrate 10 where under layer patterns such as a transistor (not shown) are formed. Baking process is then carried out at the temperature of 100 to 300° C. for 10 minutes to 2 hours to remove moisture attached on the MTO layer 12.

Thereafter, a first Ti layer 13 and a first Pt layer 14 for a lower electrode of a capacitor are is formed on the MTO layer 12, in sequence. Preferably, the first Ti layer 13 is formed to the thickness of 50 to 500 Å and the first Pt layer 14 is formed to the thickness of 1,000 to 3,000 Å. Furthermore, the first Pt layer 14 is formed by in-situ with keeping vacuum state after forming the first Ti layer 13. Annealing is then performed at the temperature 400 to 900° C. and for 10 minutes to 2 hours under $O_2$ atmosphere.

Next, on the first Pt layer 14 is formed a ferroelectric layer 15 such as a SBT ($SrBi_2Ta_2O_9$) with a Bi-layered perovskite structure. Preferably, the ferroelectric layer 15 is formed by spin coating, Liquid Source Mixed Chemical Deposition (LSMCD), Chemical Vapor Deposition (CVD) or Physical Vapor deposition (PVD).

Sequentially, a second Pt layer for an upper electrode of the capacitor is formed on the ferroelectric layer 15 to the thickness of 1,000 to 3,000 Å. Preferably, the second Pt layer is formed to a multi-layer structure by multi-step of two to ten steps. In this embodiment, the second Pt layer is formed of two-layers 16A and 16B, as shown in FIG. 1 to FIG. 6.

Furthermore, the second Pt layer is formed at the low vacuum of 10 to 100 mTorr and the high temperature of 300 to 1,000° C. by sputtering using the low power of 0.1 to 1 kW with adding oxygen ($O_2$) to sputtering gas such as argon (Ar), for densifying the grain boundary of the second Pt layer. Preferably, the flow rate of Ar:$O_2$ is range of 1:100 to 100:1.

Thereafter, a first TiN layer is formed on the second Pt layer to the thickness of 300 to 1,000 Å, and a mask pattern (not shown) for an upper electrode is formed thereon. The first TiN layer is then etched using the mask pattern to form a first TiN pattern 17 and the mask pattern is removed by a well known method. The second Pt layer is then etched using the etched first TiN pattern 17 as a hard mask to form an upper electrode 16.

Figure 2:
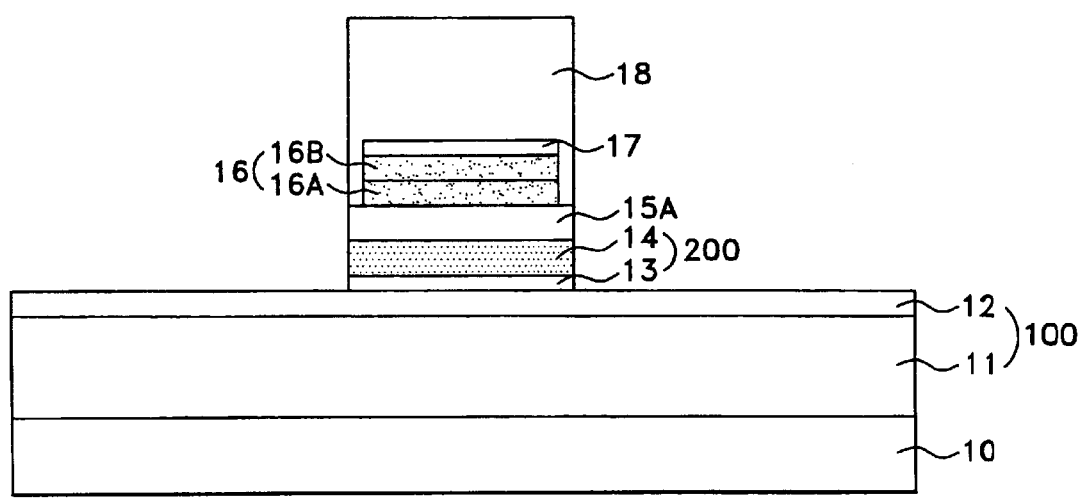
FIG. 2 is a cross sectional view showing the step of forming a ferroelectric pattern and a lower electrode using a photoresist pattern.

Referring to FIG. 2, a photoresist pattern 18 for a lower electrode is formed on the ferroelectric layer 15 so as to cover the upper electrode 16. The ferroelectric layer 15, the first Pt layer 14 and the first Ti layer 13 are then etched using the photoresist pattern 18 as an etch mask, to form a lower electrode 200 and a ferroelectric pattern 15A, thereby completing a capacitor including the lower elctrode 200, the ferroelectric pattern 15A and the upper electrode 16.

Figure 3:
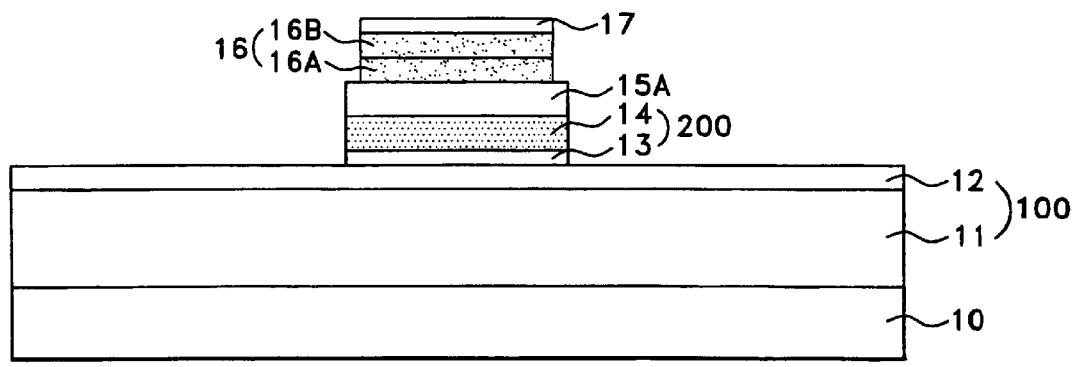
FIG. 3 is cross sectional view showing the step of removing the photoresist pattern of FIG. 2.

Referring to FIG. 3, the photoresist pattern 18 is removed by a well known method. The first TiN pattern 17 is thermal-treated using a furnace at the temperature of 400 to 900° C. and for 10 minutes to 2 hours under the $O_2$ atmosphere to oxidize the surface thereof for improving adhesion between the upper electrode 16 and a capping oxide layer which will be formed after.

Figure 4:
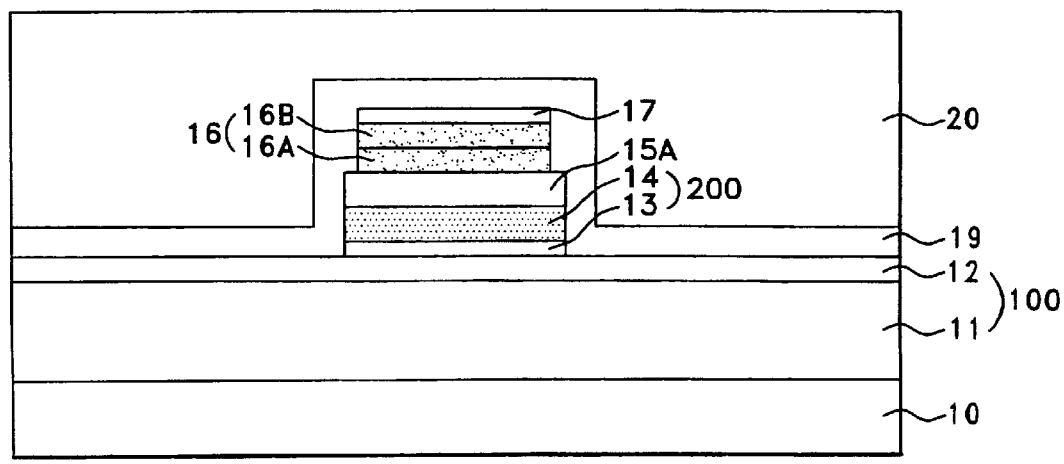
FIG. 4 is cross sectional view showing the step of depositing a capping oxide layer and a second intermediate insulating layer on the structure of FIG. 3.
Figure 5:
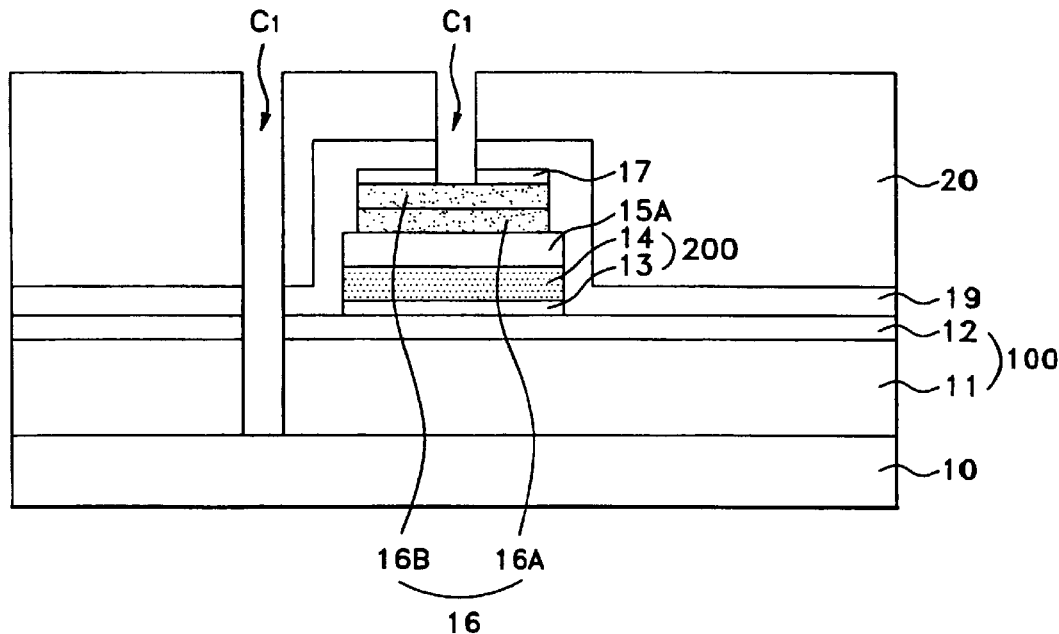
FIG. 5 is cross sectional view showing the step of forming contact holes for a capacitor and a transistor by a conventional patterning process.

As shown in FIG. 4, a capping oxide layer 19 is formed on the structure of FIG. 3 and a second intermediate insulating layer 20 is formed thereon. As shown in FIG. 5, the second intermediate insulating layer 20, the capping oxide layer 19 and the first TiN layer 17 are etched to form a first contact hole C1 exposing the upper electrode 16, and the second intermediate insulating layer 20, the capping oxide layer 19, the MTO layer 12 and the BPSG layer 11 are etched to form a second contact hole C2 exposing an active region of the transistor (not shown).

Figure 6:
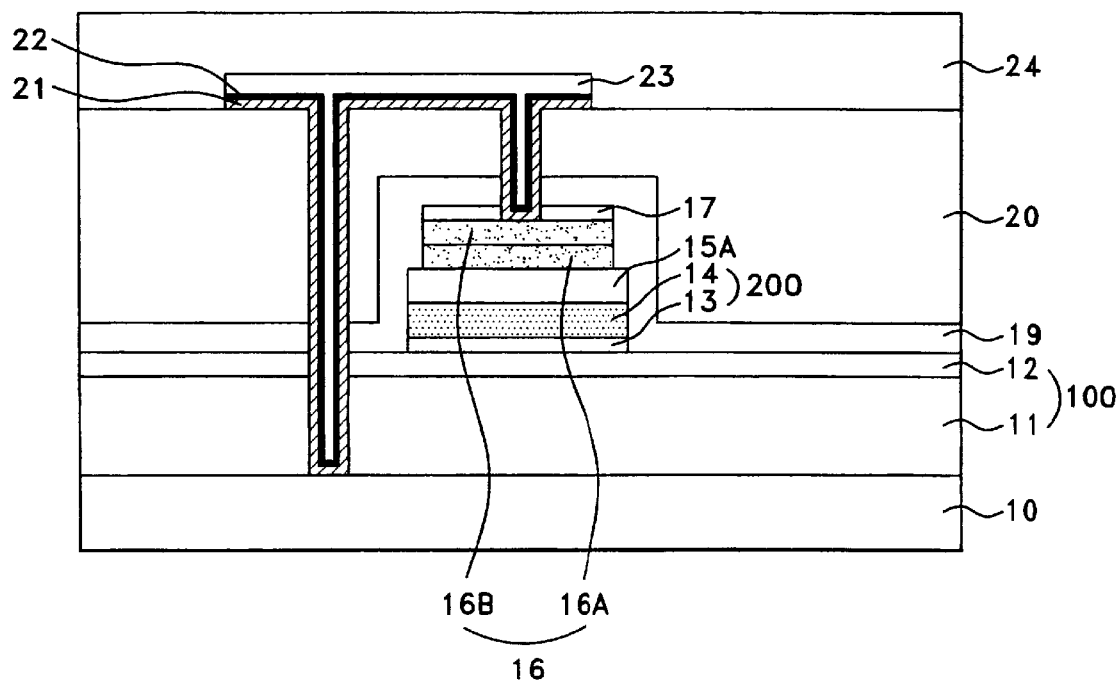
FIG. 6 is cross sectional view showing the steps of forming a metal interconnection line for connecting the transistor with the capacitor and forming a third intermediate insulating layer on the overall substrate.

As shown in FIG. 6, a second Ti layer 21 is formed on the surfaces of the first and second contact holes C1 and C2 and on the second intermediate insulating layer 20, for improving adhesion between an oxide and a metal interconnection line which will be formed after and reducing contact resistance. A second TiN layer 22 is then formed on the second Ti layer 21, for preventing diffusion of Si and Ti. A metal layer 23 is then formed on the second TiN layer 22. Preferably the metal layer 23 is formed of W layer or Al layer.

Next, the metal layer 23, the second TiN layer 22 and the second Ti layer 21 are etched to form a metal interconnection line. A third intermediate insulating layer 24 is then formed on the overall substrate. Thereafter, conventional processes are performed to complete a ferroelectric memory device, as not shown in the drawings.

According to the present invention as above described, a Pt layer for an upper elctrode is formed to a multi-layer structure by multi-step. The Pt layer of the multi-layer structure is also formed by sputtering at high temperature, high pressure and low power, so that its grain boundary is densified, thereby increasing diffusion path. By adding $O_2$ to sputtering gas when forming the Pt layer, $O_2$ is used for trapping center of Ti during thermal-treating process which will be performed after, thereby preventing Ti from diffusing into a ferroelectric layer through the Pt layer of the upper electrode. As a result, the electrical properties of a ferroelectric memory device are improved.

Although the preferred embodiment of this invention has been disclosed for illustrative purpose, those skilled in the art will appreciate that various modifications, additions and substitutions are possible, without departing from the scope and spirit of the invention as described in the accompanying claims.

What is claimed is:

1. A method of manufacturing a ferroelectric memory device, comprising the steps of:

forming a first intermediate insulating layer on a semiconductor substrate on which a transistor is formed;

forming a first conductive layer for a lower electrode of a capacitor and a ferroelectric layer on the first intermediate insulating layer, in sequence; and forming a Pt layer for an upper electrode of the capacitor on the ferroelectric layer to a multi-layer structure, the Pt layer containing oxygen therein.

2. The method according to claim 1, wherein the Pt layer of the multi-layer structure is formed at the pressure of 10 to 100 mTorr, the temperature of 300 to 1,000° C. and the power of 0.1 to 1 kW.

3. The method according to claim 1, wherein the Pt layer of the multi-layer structure is formed using Ar and $O_2$, the flow rate of Ar:$O_2$ being 1:100 to 100:1.

4. The method according to claim 1, wherein the first conductive layer is formed of a Pt layer and the ferroelectric layer is formed of a $SrBi_2Ta_2O_9$ layer.

5. The method according to claim 1, further comprising the steps of:

forming a TiN layer on the Pt layer and etching the TiN layer to form a TiN pattern defining an upper electrode;

etching the Pt layer using the TiN pattern as an etch mask to form the upper electrode; and etching the ferroelectric layer and the first conductive layer to form a ferroelectroic pattern and a lower electrode.

6. The method according to claim 5, further comprising the steps of:

thermal-treating the TiN pattern under $O_2$ atmosphere;

forming a capping oxide layer and a second intermediate insulating layer on the overall substrate, in sequence;

etching the second intermediate insulating layer, the TiN pattern and the capping oxide layer to form a first contact hole exposing the upper electrode, and etching the second intermediate insulating layer, the capping oxide layer and the first intermediate insulating layer to form a second contact hole exposing a active region of the transistor; and forming a metal interconnection line to connect the active region of the transistor with the capacitor through the first and second contact holes.

* * * * *